(12) United States Patent
Nakagama et al.

(10) Patent No.: US 6,248,291 B1
(45) Date of Patent: *Jun. 19, 2001

(54) PROCESS FOR PRODUCING SPUTTERING TARGETS

(75) Inventors: Susumu Nakagama; Masao Higeta; Atsushi Hayashi, all of Kanagawa (JP)

(73) Assignee: Asahi Glass Company Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/952,078

(22) PCT Filed: May 17, 1996

(86) PCT No.: PCT/JP96/01312

§ 371 Date: Dec. 12, 1997

§ 102(e) Date: Dec. 12, 1997

(87) PCT Pub. No.: WO96/36746

PCT Pub. Date: Nov. 21, 1996

(30) Foreign Application Priority Data

May 18, 1995 (JP) .................................................. 7-120197

(51) Int. Cl.$^7$ ........................................................ B22F 3/14
(52) U.S. Cl. .................................................. 419/46; 419/49
(58) Field of Search ........................................ 419/49, 46

(56) References Cited

U.S. PATENT DOCUMENTS

| | | | |
|---|---|---|---|
| 4,943,319 | * | 7/1990 | Yanagawa et al. ..................... 75/229 |
| 4,943,362 | * | 7/1990 | Schlamp et al. ................. 204/298.13 |
| 4,954,170 | * | 9/1990 | Fey et al. .............................. 75/229 |
| 5,342,571 | * | 8/1994 | Dittmar et al. ........................ 419/13 |
| 5,500,301 | * | 3/1996 | Onishi et al. ......................... 428/457 |
| 5,510,173 | * | 4/1996 | Pass et al. ............................ 428/216 |
| 5,518,432 | * | 5/1996 | Katou et al. ........................... 445/10 |

FOREIGN PATENT DOCUMENTS

| | | |
|---|---|---|
| 0 243 995 | 11/1987 | (EP) . |
| 4-323366 | * 11/1992 | (JP) . |

* cited by examiner

*Primary Examiner*—Daniel Jenkins
(74) *Attorney, Agent, or Firm*—Oblon, Spivak, McClelland, Maier & Neustadt, P.C.

(57) ABSTRACT

A process for producing sputtering targets, which comprises molding a mixture of a powder of a high-melting substance having a melting point of 900° C. or above with a powder of a low-melting metal having a melting point of 700° C. or below at a temperature below the melting point of the low-melting metal under heat and pressure.

3 Claims, 1 Drawing Sheet

PROCESS FOR PRODUCING SPUTTERING TARGETS

TECHNICAL FIELD

The present invention relates to a process for producing composite sputtering targets composed of a high-melting substance and a low-melting metal.

BACKGROUND ART

In recent years, sputtering is extensively used for formation of thin films, and composite targets composed of at least two components are demanded to provide in thin films with high performance and/or high value added.

Sputtering targets have been produced so far by melting, hot pressing and atmospheric pressure sintering. However, when these conventional techniques are employed for production of composite targets composed of a high-melting substance such as a high-melting metal or ceramic, and a low-melting substance, uniform and dense targets do not result because of the phase separation due to different densities of the components, the compositional change due to the different melting points of the components, exudation of the molter low-melting metal and other problems.

Although a process in which a mixture of a powder of a high-melting substance with a powder of a low-melting metal is molded at room temperature under pressure (Japanese unexamined patent application JP-A-4-323366) is known, the process requires high pressures of 1000-3500 kgf/cm$^2$ or above for production of dense targets and is unsuitable for production of large targets and mass production.

Further, since the modeling operation at room temperature under pressure induces residual stress in a target produced by the process, sputtering targets produced by the process have a problem of their poor in dimensional stability which emerges as a permanent elongation of 0.5–2% based to on the length of the targets due to thermal hysteresis during bonding or film formation, and a problem of racking and peeling during sputtering.

On the other hand, production. of dense targets from a mixture of a powder of a high-melting substance with a powder of a low-melting metal by uniaxial pressing at room temperature, which is usually employed in molding ceramics, requires a very large machine which would cost too much to avoid a tremendous increase in the production cost, and is, therefore, impractical.

Therefore, the object of present invention is to provide composite dense targets composed of a high-melting substance and a low-melting metal without using a large machine by an economical process which solves the above-mentioned drawbacks of the prior art.

DISCLOSURE OF THE INVENTION

The present invention provides a process for producing sputtering targets, which comprises molding a mixture of a powder of a high-melting substance having a melting point of 900° C. or above with a powder of a low-melting metal having a melting point 700° C. or below at a temperature below the melting point of the low-melting metal under heat and pressure.

BEST MODE FOR CARRYING OUT THE INVENTION

Figure 1:
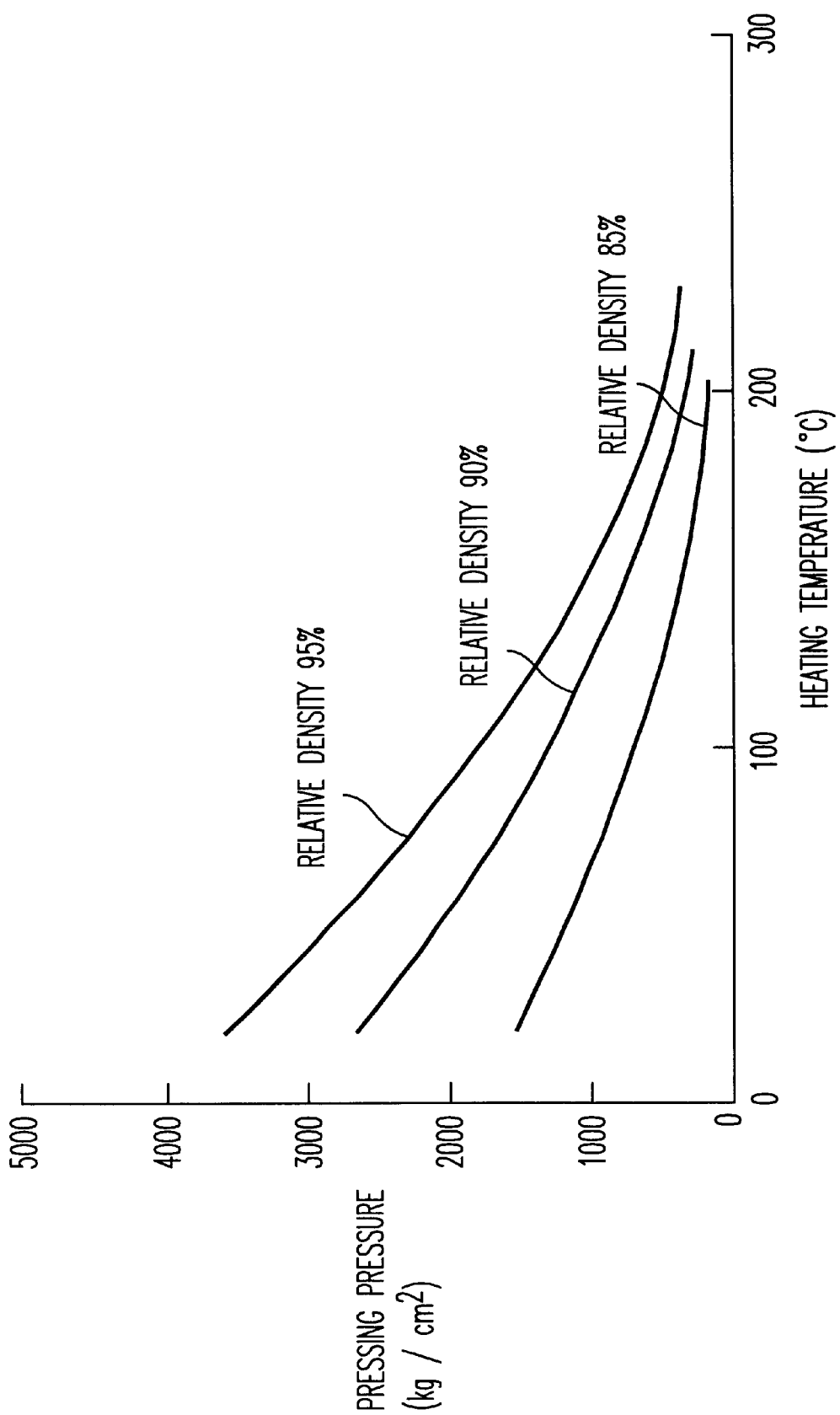
FIG. 1 is a graph which illustrates the relationship between the heating temperature and the applied pressure for production of targets from a powder mixture comprising Si and Sn in a volume ratio of 50:50.

The high-melting substance used in the present invention is a substance having a melting point of 900° C. or above. In particular, the simple body or a compound of at least one element selected from the group consisting of Zr, Ti, Ta, Hf, Mo, W, Nb, La, Si, Ni, C, B and Cr is preferred because they are a practical materials for film formation by sputtering. As the compound, oxides, carbides, nitrides, borides, silicides, sulfides, chlorides, fluorides and various salts are mentioned.

The low-melting metal used in the present invention is a metal having a melting point of 700° C. or below. In particular, a metal containing at least one metal selected from the group consisting of In, Sn, Zn and Al is preferred, because they are practical materials for film formation by sputtering and easy to handle by virtue of their chemical stability. Typical low-melting metals are In, Sn, Zn and Al (melting points 156° C., 232° C., 420° C., 660° C., respectably). A metal having a melting point of 250° C. or below such as In and Sn is particularly preferred. An alloy containing In, Sn, Zn or Al may be used.

As the combination of a low-melting metal and a high-melting substance, In—Si, In—SiO$_2$, In—SnO$_2$, In—MgO, In—Ga$_2$O$_3$, In—ZnO, Sn—Si, Sn—Ti, Sn—Zr, Sn—Cr, Sn—ZrB$_2$, Sn—ZrSi$_2$, Sn—TiSi$_2$, Sn—Zr—Si, Sn—Ti—Si, Sn—SiO$_2$, Sn—SiC, Sn—TiO$_2$, Sn—SnO$_2$, Sn—In$_2$O$_3$, Sn—ZnO, Sn—CeF$_3$, Sn—LaF$_3$, Sn—AlF$_3$, Zn—Cr, Zn—Si, Zn—Al$_2$O$_3$, Zn—SiO$_2$, Zn—SnO$_2$, Zn—CeO$_2$, Zn—Ga$_2$O$_3$, Zn—ZnS, Al—Si, Al—Cr, Al—Al$_2$O$_3$, Al—SiO$_2$, Al—TiO$_2$, Al—TiC, Al—SiC, Al—Al$_4$C$_3$, Al—NaF, Al—CaF$_2$, Al—MgF$_2$ or Al—AlF$_3$ may be mentioned.

It is desirable that targets produced according to the present invention have a porosity of 20% or a below, namely a relative density of 80% or above, preferably a porosity of 10% or below, namely a relative density of 90% or above in order to secure stable discharge during film formation by sputtering and prevent breakage due to insufficient strength. In this specification, the porosity and the relative density are represented by equation (1).

Porosity (%)=(1−(Bulk density/true density))×100 Relative density (%)=(Bulk density/true density)×100     (1)

The bulk density (g/cm$^3$) is the experimental density calculated from the size and the weight of an actually prepared target, and the true density is the theoretical density calculated from the individual theoretical densities of the components. For example, where component A and component B are a vol % and b vol % respectively (wherein a+b=100(%)), the true density $\rho$(g/cm$^3$) is given by $\rho=(a\rho_A + b\rho_B)/100$ wherein $\rho_A$(g/cm$^3$) is the theoretical density of component A, and $\rho_B$(g/cm$^3$) is the theoretical density of component B.

Targets produced according to the present invention by molding a mixture of a powder of a high-melting substance with a powder of a low-melting metal under heat and pressure are constituted by a mere mixture of the high-melting substance with the low-melting metal and do not require chemical bonds between them, unlike targets produced by conventional processes such as a melting process or processes involving sintering.

A powder of a low-melting metal and a powder of a high-melting substance (hereinafter referred to collectively as a raw material powder) are mixed, and then molded into a target under heat and pressure at a temperature below the melting point of the low-melting metal (namely at such a temperature that the molter low-melting metal does not exude) in the form of a powder mixture or, if necessary, after molded by uniaxial pressing at room temperature. The composition of the resulting target is much the same as the composition of the raw material powder.

The particle size of the raw material powder is preferably from 1 to 300 μm. A raw material powder containing particles larger than 300 μm is undesirable because the resulting target causes abnormal discharge, breaks during sputtering or has an uneven density distribution which leads to a fluctuation in sputtering speed.

A raw material powder having a particle size below 1 μm is also undesirable because it is difficult to mix uniformly and is so poor in moldability to form a brittle molded body or gives a target which is likely to break during bonding with a backing plate or during sputtering.

In production of a target, a raw material powder is mixed homogeneously enough and then heated at a temperature below the melting point of the low-melting metal. The heating method is not particularly restricted, and in some cases, control of the humidity and/or the atmosphere is desired. As the pressing method, uniaxial pressing or other pressing technics may be employed.

The heating temperature is lower than the melting point of the low-melting metal and preferably not lower than 75° C. At a heating temperature lower than 75° C., a high density is hardly attained and a target with insufficient strength tends to be obtained, although it depends on the components and composition.

Particularly preferred heating temperatures are lower than the melting point of the low-melting point metal to be used by at most 50° C.

With respect to the pressure applied for molding of a target, a pressure of 1000 kgf/cm² or below is enough to produce a target with a relative density of 90% or above, although it depends on the components and the composition of the raw material powder to be used. By sitting the heating temperature at a temperature lower than the melting point of the low-melting metal by at most 50° C., it is possible to lower the pressure to 500 kgf/cm² or below.

FIG. 1 shows the relationship between the heating temperature and the applied pressure in production of a target from a powder mixture comprising Si and Sn in a volume ratio of 50:50. FIG. 1 indicates that as the heating temperature approaches the melting point of the low-melting metal, the pressure required to attain a given density decreases. For example, with the Si—Sn system (volume ratio 50:50), a relative density of 90% is attained at 250° C. at about 150 kgf/cm².

The time for heating under pressure is preferably from 0 second (not held) to 300 seconds, although it depends on the components used and their compositional ratio.

A powder of a low-melting metal serves not only as a binder to hold particles of a high-melting substance together, but also as a filler to fill the voids between particles of the high-melting substance. In order to have such actions, a powder of a low-melting metal preferably constitutes from 20 to 95 vol % of the raw material powder, although it depends on the combination of the components and the particle size of the raw material powder. In particular, in order to attain a relative density of 90%, which is desirable for a sputtering target, a powder of a low-melting metal preferably constitutes from 35 to 95 vol % of the raw material powder.

In the specification, vol % is the proportion (percentage) of the volume of each component obtained by dividing its weight by its theoretical density. For example, the proportion (vol %) of powder component A in a powder mixture of component A and component B) is given by equation (2).

$$\text{Proportion (vol \%) of A} = (W_A/\rho_A) \times 100/(W_A/\rho_A + W_B/\rho_B) \quad (2)$$

Here $W_A$ and $W_B$ are weights (g) of components A and B, respectively, and $\rho_A$ and $\rho_B$ are the theoretical densities (g/cm³) of components A and B, respectively.

Low-melting metals (such as In, Sn, Zn and Al) are so ductile and liable to plastic deformation as to be deformable under pressure. Whereas, they require very high pressures at room temperature, whereas they are easy to deform and can be molded at a low pressure when heated nearly to their melting points. A powder of such a low-melting metal serves not only as a binder to hold particles of a high-melting substance together but also as a filler to fill the voids between particles of the high-melting substance to produce targets according to the present invention, and therefore makes it possible to economically produce dense targets without a large machine.

Besides, since the molding is carried out under heat and under a low pressure, the resulting target has much less residual internal stress as compared with targets with the same density molded at room temperature under a high pressure. This makes it possible to control the permanent elongation of a target during bonding or film formation due to thermal hysteresis below 0.05% based on the length of the target. Therefore, such a molding operation improves dimension stability of targets and solves problems which occur during sputtering such as racking or peeling of targets.

Targets obtained according to the present invention can be recycled after use by pressing them together with a newly added powder of the same composition to compensate for their regional losses from consumption in the same manner as their production and are therefore economically advantageous.

In the step for bonding a target and a backing plate, a target obtained according to the present invention can be bonded to a backing plate by pressing the target placed on the backing plate in the same manner as in its production without suffering heat of several hundreds °C., which is employed in usual bonding processes. When an In foil is interposed between the backing plate and the target at the time of bonding, their bond becomes stronger.

EXAMPLE 1

A Sn powder (melting point 232° C.) having a particle sizes distribution within a range of from 3 to 120 μm (average particle size 40 μm, hereinafter, an average particle size means the particle size at which the cumulative frequency fraction is 50 vol %) as a powder of a low-melting metal and a Si powder (melting point 1414° C.) having a particle size distribution within a range of from 3 to 120 μm (average particle size 40 μm) has a powder of a high-melting substance were mixed in a V-type mixer so that Sn constituted 57 vol % of the resulting mixture (total weight 2 kg), and the mixture was loaded into a mold for a uniaxial pressing machine and subjected to preliminary press molding under a pressure of 400 kgf/cm².

Then, the resulting preform was heated to 220° C. The heated preform was set in a mold preheated to the same temperature and subjected to uniaxial press molding under pressure of 400 kgf/cm². The resulting molded form had a bulk density of 4.9 g/cm³ and a relative density of 95%. The dense molded form was made into, a target having a diameter of 6 inch.

The resulting target was used in oxidation reactive sputtering to form a Sn—Si composite oxide thin film. The thin film was a sufficiently oxidized thin film and transparent, and the Sn/Si ratio (atomic ratio) of the thin film was about the same as that of the target. The target was quite difficult to break, and no abnormal discharge occurred during the sputtering.

The target was cut into 1 cm cubes, ten of which were selected as samples to determine the composition distribution by fluorescence X ray analysis and the density distribution by the Archimedes method. The results confirmed the highly uniform composition distribution and density distribution.

EXAMPLE 2

Sn—Si targets were prepared by using raw material powders having different compositions shown in Table 1 in the same manner as in Example 1 but without preliminary press molding, at a molding temperature of 220° C. under various molding pressures. Table 1 shows the compositions of the raw material powders, the pressures applied to produce targets and the relative densities of the resulting targets.

The targets were used in oxidation reactive sputtering to form Sn—Si composite oxide thin films. The thin films were sufficiently oxidized to thin films and transparent, and the Sn/Si ratios (atomic ratios) were about the same as those of the targets. The targets were quite difficult to break, and no abnormal discharge occurred during the sputtering.

TABLE 1

| Raw material powder | | | |
|---|---|---|---|
| Low-melting metal Sn (vol %) | High-melting substance Si (vol %) | Pressure (kgf/cm²) | Relative density (%) |
| 15 | 85 | 400 | 80 |
| 20 | 80 | 400 | 82 |
| 30 | 70 | 400 | 84 |
| 35 | 65 | 400 | 87 |
| 40 | 60 | 400 | 94 |
| 50 | 50 | 400 | 97 |
| 70 | 30 | 350 | 98 |
| 90 | 10 | 350 | 99 |

EXAMPLE 3

In—Si targets were prepared by using raw material powders having different compositions shown in Table 2 in the same manner as in Example 1 but without preliminary press molding, at a molding temperature of 145° C. under various molding pressures. The melting point of In is 156° C. Table 2 shows the compositions of the raw material powders, the pressures applied to produce targets and relative densities of the resulting targets.

The targets were used in oxidation reactive sputtering to form In—Si composite oxide thin films. The resulting thin films were sufficiently oxidized thin films and transparent, and the In/Si ratios (atomic of the thin films were about the same as those of the target. The targets were quite difficult to break, and no abnormal discharge occurred during the sputtering.

TABLE 2

| Raw material powder | | | |
|---|---|---|---|
| Low-melting metal In (vol %) | High-melting substance Si (vol %) | Pressure (kgf/cm²) | Relative density (%) |
| 15 | 85 | 400 | 80 |
| 20 | 80 | 400 | 85 |
| 30 | 70 | 400 | 87 |
| 35 | 65 | 350 | 90 |
| 40 | 60 | 350 | 94 |
| 50 | 50 | 350 | 97 |
| 70 | 30 | 350 | 98 |
| 90 | 10 | 300 | 99 |

EXAMPLE 4

Zn—Cr targets were prepared by using raw material powders having difference compositions shown in Table 3 in the same manner as Example 1 but without preliminary press molding of the powder mixtures at a molding temperature of 405° C. under various molding pressures. The melting point of Zn is 420° C., and that of Cr is 1905° C. Table 3 shows the compositions of the raw material powders, the pressure applied to produce targets and the relative densities of the resulting targets.

The targets were used in oxidation reactive sputtering to form Zn—Cr composite oxide thin films. The resulting thin films were sufficiently oxidized thin films and transparent, and the Zn/Cr ratios (atomic ratios) were about the same as those of the targets. The targets were quite difficult to break, no abnormal discharge occurred during the sputtering.

TABLE 3

| Raw material powder | | | |
|---|---|---|---|
| Low-melting metal Zn (vol %) | High-melting substance Cr (vol %) | Pressure (kgf/cm²) | Relative density (%) |
| 15 | 85 | 400 | 80 |
| 20 | 80 | 400 | 82 |
| 30 | 70 | 400 | 84 |
| 35 | 65 | 400 | 87 |
| 40 | 60 | 400 | 94 |
| 50 | 50 | 400 | 97 |
| 70 | 30 | 350 | 98 |
| 90 | 10 | 300 | 99 |

EXAMPLE 5

Sn—Si targets were prepared by using the same raw material powder in the same manner as in Example 1 but without preliminary press molding of the powder mixture at a molding temperature of 220° C. at a molding pressure of 400 kgf/cm². The resulting molded body was cut down to 100×100×10 mm, then heated at 220° C. for 24 hours and cooled to room temperature. The dimensional change of the 100 mm long edge of the molded body caused by the heating was determined, and its ratio was calculated, which was destinated as the coefficient of permanent expansion. The results are shown in Table 4.

Comparative Example 1

A target was molded by using the same raw material powder as in Example 1 by isostatic pressing (rubber pressing) at room temperature under a molding pressure of 3500 kgf/cm² according to the method disclosed in Japanese Unexamined Patent Publication JP-A-4-323336. The resulting molded body was cut in the same manner as in Example 5 and the coefficient of permanent expansion was measured. The results are shown in Table 4.

TABLE 4

| | Raw material powder | | Tem- pera- ture | Pressure (kgf/ | Demension | | Coeffi- cient of permanent expansion |
|---|---|---|---|---|---|---|---|
| | Sn | Si | (° C.) | cm²) | Before heat- ing | After heat- ing | (%) |
| Example 5 | 57 | 43 | 220 | 400 | 100.00 | 100.02 | 0.02 |
| Comparative Example 1 | 57 | 43 | 25 | 3500 | 100.00 | 100.40 | 0.40 |

Table 4 indicates that the targets obtained according to the present invention has excellent dimension stability against heating and has an extremely small coefficient of permanent expansion.

Industrial Applicability

The present invention provide dense composite targets composed of a high-melting substance and a low-melting metal which are uniform and quite difficult to break and have porosities not higher than 10%.

Targets obtained according to the present invention can be easily used to form alloy thin films and composite oxide, nitride or carbide thin films by unreactive sputtering.

Alloy targets obtained according to the present invention can also be used to formation of composite oxide, nitride or carbide thin films by oxidation, nitrogenation or carbonigation reactive sputtering.

Targets obtained according to the present invention can be recycled after use by pressing them together with a newly powder of the same composition to compensate for their regional losses from consumption in the same manner as their production and are therefor economically advantageous.

In the step for bonding a target and a backing plate, a target obtained according to the present invention can be bonded to a backing plate by pressing the target placed on the backing plate in the same manner as in its production without suffering heat of several hundreds °C., which is employed in usual bonding processes.

What is claimed is:

1. A process for producing sputtering targets, which comprises molding a mixture of a powder of a high-melting substance having a melting point of 900° C. or above with a powder of a low-melting metal having a melting point of 700° C. or below at a temperature below the melting point of the low-melting metal under heat and pressure, wherein the heating temperature is lower than the melting point of the low-melting metal by at most 50° C. and the pressure is not higher than 500 kgf/cm², and wherein the powder of the low-melting metal is of at least one metal selected from the group consisting of In and Sn, wherein the mixture contains from 20 to 95 volume % of the powder of the low-melting metal and the target has a relative density of at least 90%.

2. The process for producing sputtering targets according to claim 1, wherein the heating temperature is not lower than 75° C.

3. The process for producing sputtering targets according to any one of claims 1 or 2, wherein the powder of the high-melting substance is a powder of a simple body or a compound of at least one element selected from the group consisting of Zr, Ti Ta, Hf, Mo, W, Nb, La, Si, Ni, C, B and Cr.

\* \* \* \* \*